United States Patent
Pflum

(10) Patent No.: US 9,246,494 B2
(45) Date of Patent: Jan. 26, 2016

(54) METERING CIRCUIT INCLUDING A FLOATING COUNT WINDOW TO DETERMINE A COUNT

(71) Applicant: Silicon Laboratories Inc., Austin, TX (US)

(72) Inventor: Marty Pflum, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 207 days.

(21) Appl. No.: 14/135,554

(22) Filed: Dec. 19, 2013

(65) Prior Publication Data

US 2015/0180479 A1      Jun. 25, 2015

(51) Int. Cl.
| | |
|---|---|
| *G01F 15/06* | (2006.01) |
| *H03K 21/10* | (2006.01) |
| *B67D 7/22* | (2010.01) |
| *H03K 5/1532* | (2006.01) |
| *H03K 23/64* | (2006.01) |
| *G01R 23/10* | (2006.01) |

(52) U.S. Cl.
CPC ............... *H03K 21/10* (2013.01); *B67D 7/228* (2013.01); *H03K 5/1532* (2013.01); *B65H 2220/01* (2013.01); *B65H 2513/11* (2013.01); *G01R 23/10* (2013.01); *H03K 23/64* (2013.01)

(58) Field of Classification Search
None
See application file for complete search history.

(56) References Cited

U.S. PATENT DOCUMENTS

| | | | |
|---|---|---|---|
| 4,045,728 A | 8/1977 | Fletcher et al. | |
| 6,549,120 B1 | 4/2003 | de Buda | |
| 7,723,979 B2 | 5/2010 | Ashburn | |
| 2009/0189778 A1 | 7/2009 | Juan et al. | |
| 2010/0302061 A1 | 12/2010 | Winter et al. | |
| 2011/0182398 A1* | 7/2011 | Iwashita et al. ................. | 377/19 |
| 2013/0167652 A1* | 7/2013 | Pflum et al. ..................... | 73/861 |
| 2013/0197831 A1* | 8/2013 | Yonezawa et al. .............. | 702/47 |
| 2013/0269447 A1* | 10/2013 | Takemura et al. ......... | 73/861.27 |
| 2015/0035509 A1* | 2/2015 | Koyama et al. ............... | 323/283 |
| 2015/0177280 A1* | 6/2015 | Berringer ............... | G01R 15/00 |

* cited by examiner

*Primary Examiner* — Tuan T Lam
(74) *Attorney, Agent, or Firm* — Cesari & Reed LLP; R. Michael Reed

(57) ABSTRACT

A method includes receiving a count corresponding to a number of peaks of a resonant signal that exceed a reference signal and comparing the count to a floating count window defined by a first count threshold and a second count threshold, the first count threshold is larger than the second count threshold. The method further includes selectively shifting the floating count window in a direction of the count when the count falls outside of the floating count window.

20 Claims, 6 Drawing Sheets

METERING CIRCUIT INCLUDING A FLOATING COUNT WINDOW TO DETERMINE A COUNT

FIELD

The present disclosure is generally related to metering circuits, such as circuits configured to count signal peaks from a ringing signal to determine usage of a utility, for example.

BACKGROUND

Water and gas meters use a variety of measuring and sensing techniques. One method of sensing position and rotation of a metering apparatus uses inductor-capacitor (LC) sensing, which employs an LC resonant circuit. An LC meter interface may stimulate the LC resonant circuit and measure the response (a ringing waveform).

SUMMARY

In an embodiment, a method includes receiving a count corresponding to a number of peaks of a resonant signal that exceed a reference signal and comparing the count to a floating count window defined by a first count threshold and a second count threshold, the first count threshold is larger than the second count threshold. The method further includes selectively shifting the floating count window in a direction of the count when the count falls outside of the floating count window.

In another embodiment, a metering circuit includes a first comparator including an input to receive a resonant signal, a second input to receive a reference signal, and an output. The metering circuit further includes a counter including an input coupled to the output and including an output to provide a count corresponding to a number of peaks of the resonant signal that exceed the reference signal. The metering circuit also includes a second comparator to compare the count to a floating count window defined by a first count threshold and a second count threshold and a controller coupled to an output of the comparator and configured to selectively shift the floating count window in a direction of the count.

In still another embodiment, an apparatus includes a first comparator having a first input to receive an input signal, a second input to receive a reference signal, and an output. The apparatus further includes a counter having an input coupled to the output of the first comparator, and includes an output to provide a count. The apparatus also includes a count discriminator circuit to compare the count from the counter to a floating count window and to shift the floating count window to match the count when the count falls outside of the floating count window.

BRIEF DESCRIPTION OF THE DRAWINGS

In the following discussion, the same reference numbers are used in the various embodiments to indicate the same or similar elements.

DETAILED DESCRIPTION OF ILLUSTRATIVE EMBODIMENTS

Metering circuits often use a threshold to compare against an input signal to decide whether a condition is met. However, changes in temperature and voltage may change the input signal and/or the threshold. Instead of performing calibrations to adjust the threshold for such changes, embodiments of a metering circuit are described below that use a floating count window to track changes in the detection of the input signal. In particular, embodiments of the metering circuit utilize a count window having a pre-defined size that is smaller than a difference between an upper count corresponding to a first state of a system and a lower count corresponding to a second state of the system. By sizing the count window to be smaller than such a difference, changes in the count will move the window up or down, which directional changes can be represented by a change in a state of the output signal, representing a change in state of the system. An embodiment of such a metering circuit is described below with respect to FIG. 1.

Figure 1:
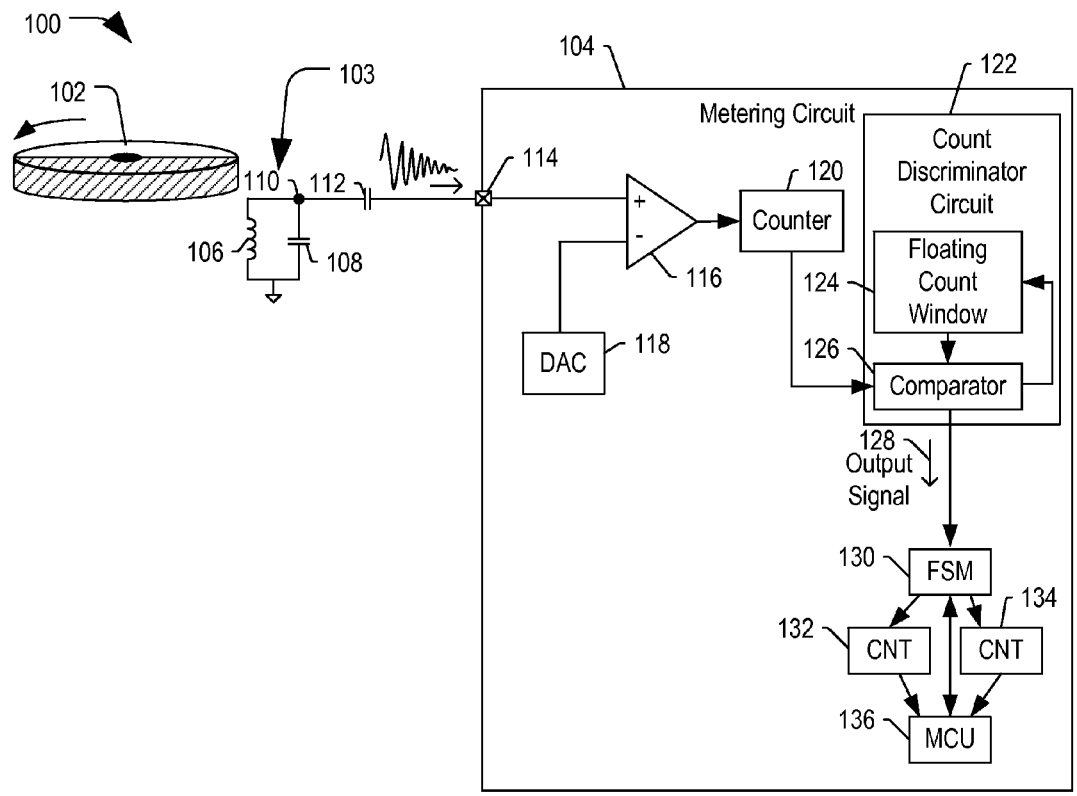
FIG. 1 is a block diagram of a system including a metering circuit employing a floating count window to determine a count according to an embodiment.

FIG. 1 is a block diagram of a system 100 including a metering circuit 104 employing a floating count window to determine a count according to an embodiment. The system 100 includes a wheel 102 that rotates in response to flow of a consumable element, such as electricity, water, gas, or other measurable substance. The wheel 102 includes a metallized portion (represented by the hash marks) and a non-metallized portion.

The system 100 further includes a resonant tank 103. The resonant tank 103 includes an inductor 106 in parallel with a capacitor 108, which are coupled between a node 110 and a power supply, such as ground. The node 110 may be coupled to the metering circuit 104 through a capacitor 112.

The metering circuit 104 includes an input 114 (such as a pad) that is coupled to the capacitor 112 and to a positive input of a comparator 116. The comparator 116 includes a negative input coupled to a digital-to-analog converter (DAC) 118, which operates as a programmable reference to supply a reference voltage to the comparator 116. The comparator 116 also includes an output to provide pulses representing peaks in the input waveform to a counter 120. The counter 120 provides a count signal, representing the number of peaks of the input waveform that exceed the threshold signal provided by the DAC 118, to an input of a comparator 126 of a count discriminator circuit 122. The comparator 126 includes a second input to receive threshold signals corresponding to a floating count window 124, and includes an output to provide an output signal 128 to an input of a controller, such as a finite state machine (FSM) 130. The FSM 130 may update count registers 132 and 134 and may be coupled to a microcontroller unit (MCU) 136.

In an embodiment, the metering circuit 104 may be used to detect peaks in a resonant signal from the LC tank circuit 103. The LC tank circuit 103 may be energized, and the energy resonates back and forth between the capacitor 108 and the inductor 106 while decaying due to inductor resistance and magnetic flux loss, producing a ringing waveform at the input 114 of the metering circuit 104. The duration of the decaying sine wave (ringing waveform) can be determined by counting the number of peaks of the ringing waveform. When a metalized section of the wheel 102 is proximate to the inductor 106 of the LC tank circuit 103, some of the magnetic flux will be absorbed by the metal, causing the sine wave to decay faster and reducing the number of peaks (counts), i.e., damping the input signal.

The comparator 116 receives the ringing waveform at its positive input and compares the waveform to a reference signal from the DAC 118. The comparator 116 produces output signal pulses that represent the peaks that exceed the reference signal. The counter 120 counts the pulses and provides the count to the comparator 126. The comparator 126 compares the count to the floating count window 124 and produces an output signal 128 based on the comparison. If the count falls within the floating count window 124, the comparator 126 continues producing the same output signal that it was already producing. However, if the count falls outside of the floating count window 124, the count discriminator circuit 122 pushes the floating count window 124 in the direction of the count. Additionally, the comparator 126 produces an output signal corresponding to the direction in which the floating count window 124 changes.

The floating count window 124 pushes one direction at a time. Each time a higher count is detected, the count discriminator circuit 122 changes the floating count window 124 to the higher count value, and the comparator 126 outputs a logic high signal. When the counts start decreasing, the count discriminator circuit 122 does not change the floating count window 124 until the count from counter 120 is small enough to push the bottom of the floating count window 124, at which point the comparator 126 changes its output from a logic high level to a logic low level. The count discriminator circuit 122 changes the floating count window 124 in the downward direction corresponding to the count. The count discriminator circuit 122 continues to change the floating count window 124 in the downward direction until the counts begin to increase. Once again, the floating count window 124 and the value of the output signal 128 of the comparator 126 do not change until the count is high enough to exceed the top of the floating count window 124. Once the count pushes the upper boundary of the floating count window 124, the output signal 128 of the comparator 126 changes from a logic low level to a logic high level. Additionally, the count discriminator circuit 122 shifts the floating count window to match the count.

Figure 2:
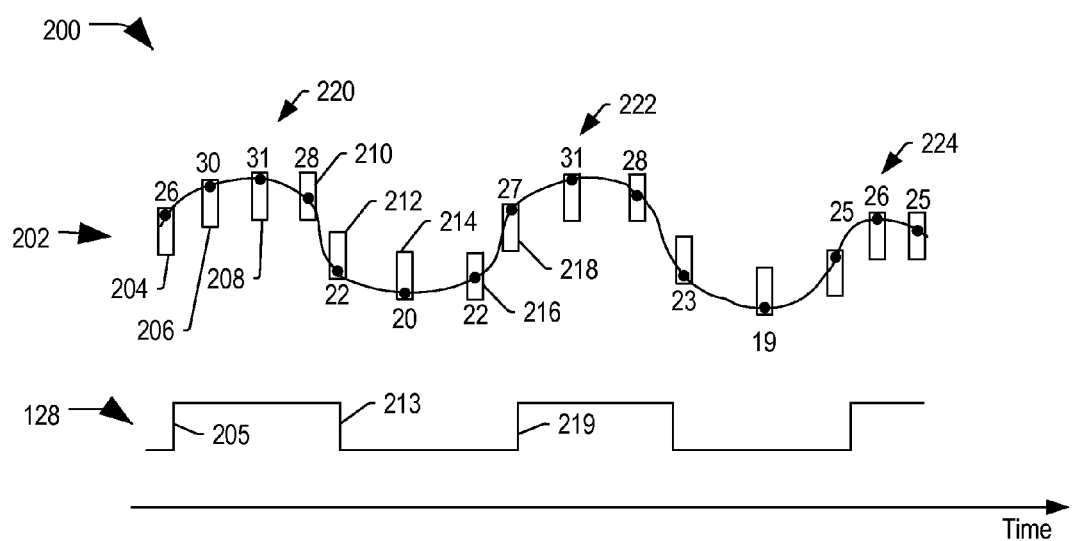
FIG. 2 is a diagram of peak counts over time and of a corresponding output signal over time for the metering circuit of FIG. 1, according to an embodiment.

FIG. 2 is a diagram 200 of peak counts 202 over time and of a corresponding output signal 128 over time for the metering circuit 104 of FIG. 1, according to an embodiment. The diagram 200 further includes floating count windows 204, 206, 208, 210, 212, 214, 216 and 218, which represent upper and lower boundaries that define a count differential that is less than a difference between a typical undamped count and a typical damped count of peaks of the input signal.

As the wheel 102 turns, the number of counts of the input signal at input 114 vary, as reflected in signal 128. In the illustrated example, the number of peaks of the input signal vary between approximately 19 (damped signal count) and 31 (undamped signal count). However, any count range can be used provided that the count is several counts less than a count difference between the highest count and the lowest count, making it possible for the count to push the floating count window up or down.

Referring now to the peak counts 202, the count value is 26 at floating count window 204, which pushes the floating count window 204 up causing the comparator 126 to change its output signal 128 from a logic low level to a logic high level at transition 205. The count value increases to 30 at floating count window 206 and to 31 at floating count window 208, which counts push the floating count windows 206 and 208 upward; however, since the direction of the push hasn't changed, the output signal 128 does not transition. At window 210, the count value decreases to 28; however, the floating count window 210 is larger than three, so the decrease from a count of 31 to a count of 28 is insufficient to shift the floating count window 210 down, and thus the output signal 128 remains at a logic high level.

At floating count window 212, the value of the peak counts 202 has fallen to 22, pushing the floating count window 212 down. In response to or in conjunction with the shifting of the floating count window, the output signal 128 of the comparator 126 transitions from the logic high level to a logic low level at transition 213. The value of the peak counts 202 falls to a count of 20 at floating count window 214, pushing the floating count window 214 in a downward direction; however, the output signal 128 remains at a logic low level because the change is in the same direction as the previous change. At floating count window 216, the peak counts 202 increase to 22; however, the floating count window is larger than two, so the increase from the count of 20 to the count of 22 is insufficient to shift the floating count window 216 up, and thus the output signal 128 remains at a logic low level.

At floating count window 218, the value of the peak counts 202 has increased to 27, which is sufficient to shift the floating count window 218 up. In response to or in conjunction with the floating count window shifting, the output signal 128 of the comparator 126 transitions from the logic low level to the logic high level at transition 219.

The peak counts 202 may vary over time as shown. At peaks 220 and 222, the count value is 31, while at peak 224, the count value is only 26. However, by utilizing a shifting of the floating count window, the variations in the peak count 202 can still be used to discriminate between a damped signal versus an undamped signal based on the transitions 205, 213, and 219 reflecting when the state of the system changes. Such transitions may reflect when the metallized portion of the wheel 102 is proximate to the inductor 106 of the resonant tank, for example.

While the example of the system 100 in FIG. 1 depicted an LC tank 103 that was passively energized or that may have been initially energized by a power source (not shown), it should be understood that the metering circuit 104 may energize the LC tank 103 or another resonant circuit to initiate the ringing waveform. An example of a metering circuit 104 that can energize the resonant tank is described below with respect to FIG. 3.

Figure 3:
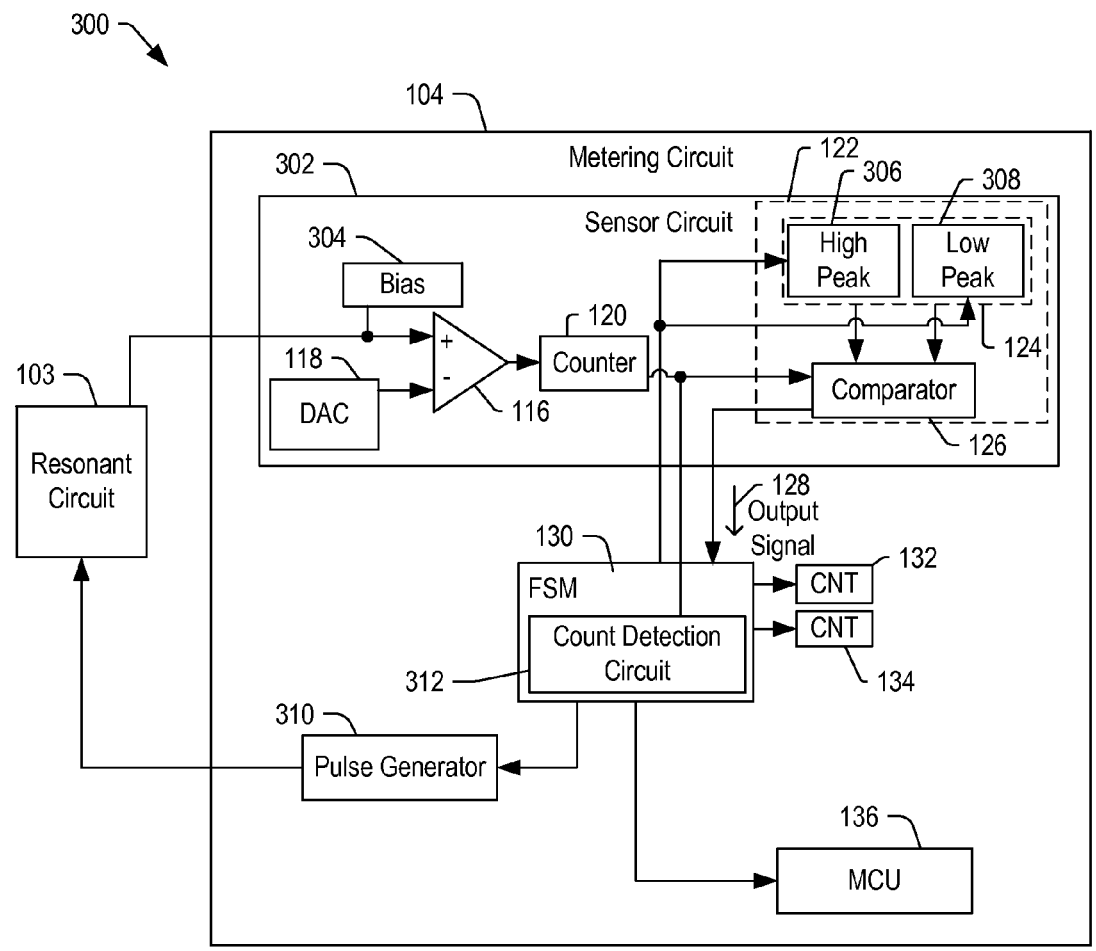
FIG. 3 is a block diagram of a system including a metering circuit employing a floating count window to determine a count according to a second embodiment.

FIG. 3 is a block diagram of a system 300 including a metering circuit 104 employing a floating count window to determine a count according to a second embodiment. In the illustrated example, metering system 300 includes metering circuit 104 coupled to a resonant circuit 103. In another embodiment, resonant circuit 103 may be replaced with a capacitive sense circuit, a Wheatstone bridge (magneto resistive) circuit, or other circuitry adapted to produce a measurable signal in response to a parameter to be measured. In an embodiment, resonant circuit 103 may be an inductor-capacitor (LC) tank circuit configured to produce a resonant signal that varies based on a rotational position of the wheel 102. In an example, the resonant signal may have a first signal characteristic when a non-metallized portion of the wheel 102 is proximate to the resonant circuit 103 and may have a second (damped) signal characteristic when a metallized portion of the wheel 102 is proximate to the resonant circuit 103.

The metering circuit 104 may include a pulse generator 310 and a sensor circuit 302, which are coupled to a controller, which may be implemented as a FSM 130. The FSM 130 may also be coupled to the MCU 136 and to count registers 132 and 134. In an embodiment, the FSM 130 may be implemented as processor readable instructions executing on a processor or on the MCU 136. In accordance with another embodiment, the FSM 130 may be implemented as a dedicated hardware implementation including, but not limited to, application specific integrated circuits, programmable logic arrays, and other circuit devices.

The sensor circuit 302 includes the comparator 116 having a first input coupled to the resonant circuit 103 to receive an input signal. The first input may also be coupled to a bias source 304 adapted to level shift the input signal. In an embodiment, the bias source 304 may level shift the input signal to a level that is approximately half of rail-to-rail voltage. The comparator 116 further includes a second input coupled to DAC 118 to receive a reference signal, and includes an output coupled to a counter 120. The counter 120 includes an output coupled the count discriminator circuit 122. In particular, the output is coupled to a first input of a comparator 126, which has a second input coupled to a floating count window 124 and an output coupled to the FSM 130. The floating count window 124 may include a high peak threshold 306 and a low peak threshold 308, which define the boundaries of the floating count window or count threshold window. The comparator 126 is adapted to receive a count from the counter 120 and to compare the count to the floating count window 124, and to produce an output signal 128 corresponding to a result of the comparison.

The FSM 130 includes a count detection circuit 312 coupled to the first input of the comparator 116. In an embodiment, the count detection circuit 312 may determine when a count at the output of counter 120 is within the floating count window 124. When the count is within the floating count window 124, the output signal 128 remains unchanged. However, when the count varies from the floating count window, the FSM 130 causes the floating count window 124 to change, shifting the floating count window to match the count. Additionally, when the count causes the floating count window 124 to change direction relative to a previous shift, comparator 126 toggles the output signal 128. The size of the floating count window may remain constant and may be configured to be less than an average difference between a high peak count corresponding to an undamped state of the system and a low peak count corresponding to a damped state of the system.

In an embodiment, the FSM 130 may cause the pulse generator 310 to provide an excitation signal to the resonant circuit 103. The sensor circuit 302 may receive an input signal in response to the excitation signal. The comparator 116 may compare the input signal to a reference signal from the DAC 118 and may produce an output signal that has a logic high level when the input signal exceeds the reference signal and a logic low level when the input signal falls below the reference signal. The output of the comparator 116 is provided to the counter 120, which counts the pulses and provides a count of the pulses to the comparator 126. The comparator 126 compares the count to a floating count window 124 and produces an output signal 128 representing the state of the system 100. In an embodiment, the output signal 128 of the comparator 126 toggles when the count causes the floating count window to shift in a different direction from a previous shift. As long as changes to the count do not push the window or continue to push the window in the same direction, the output signal 128 remains unchanged.

The count detection circuit 312 of the FSM 130 may monitor the count at the output of the counter 120, and the FSM 130 may adjust the high count threshold 306 and the low count threshold 308 by the same amount. In an embodiment, the FSM 130 may increment both the high count threshold 306 and the low count threshold 308 when the count exceeds the floating count window, and may decrement both the high count threshold 306 and the low count threshold 308 when the count falls below the floating count threshold.

In an embodiment, the FSM 130 may be configured to adjust the size of the floating count window 124 (by adjusting one or the other of the high count threshold 306 and the low count threshold 308), for example, when the floating count window 124 does not change for a period of time that exceeds a time threshold. When the floating count window 124 is moved by the count from counter 120, the FSM 130 may continue to monitor the counts to determine an average high count and average low count and may configure the size of the floating count window 124 to be less than the difference between the average high count and average low count. In an example, the FSM 130 may configure the floating count window 124 to have a size that is less than half of the difference between the average high count and the average low count.

While the illustrated example of FIG. 3 depicts a single resonant circuit 103, other types of circuits may be used, including a capacitive sense circuit, a magnetic circuit, a Wheatstone bridge circuit (magneto resistive), or other circuitry adapted to produce a measurable signal in response to a parameter to be measured. Additionally, in some embodiments, a second resonant circuit may be coupled to a second sensing circuit within the metering circuit 104. In an embodiment of the metering circuit 104 that is configured to monitor rotation of a wheel, 102 sensing circuits (such as first and second resonant circuits) may be positioned adjacent to the wheel 102 and spaced apart from one another to provide dual measurement signals, which can be processed to determine the rate of rotation as well as the direction. In this example, as a metallized portion of the wheel is proximate to one of the resonant circuits, the input signal to the sensing circuit may be dampened. In contrast, when a non-metallized portion of the wheel 102 is proximate to one of the resonant circuits, the input signal to the sensing circuit may be undamped. One possible example of a metering system including a metering circuit that can receive two different resonant signals is described below with respect to FIG. 4.

Figure 4:
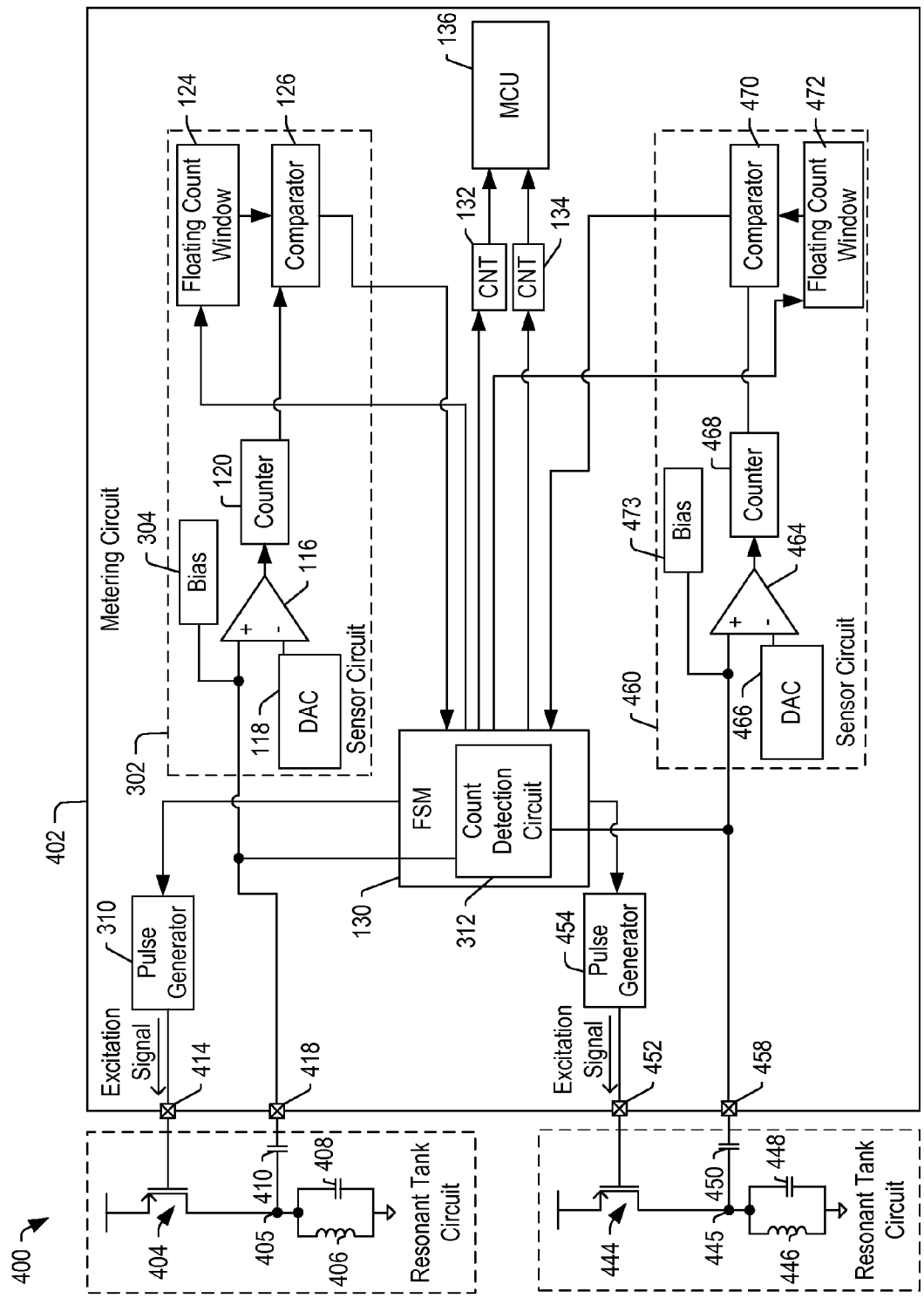
FIG. 4 is a block diagram of a system including a metering circuit employing a floating count window to determine a count according to a third embodiment.

FIG. 4 is a block diagram of a metering system 400 including a metering circuit 402 employing a floating count window 124 to determine a count according to a third embodiment. The metering circuit 402 is configured to receive a signal from two external circuits, which in this embodiment included resonant tank circuits. In the illustrated example, the metering circuit 402 includes all of the elements of metering circuit 104 of FIGS. 1 and 3, including sensor circuit 302, FSM 130, pulse generator 310, MCU 136, and count registers 132 and 134. Further, the metering circuit 402 includes additional circuitry to facilitate operation with two input signal sources, such as resonant tank circuits.

The metering circuit 402 includes the pulse generator 310 coupled between the FSM 130 and an output 414, which may be implemented as a pad, pin or contact location configurable to interconnect with an external circuit. The metering circuit 402 further includes an input 418, which may be implemented as a pad, pin, or contact location configurable to interconnect with an external circuit. The input 418 may be coupled to the sensor circuit 302.

The sensor circuit 302 includes the comparator 116 having a first input coupled to input 418 and to the bias source 304, a second input coupled to the DAC 118, and an output coupled to the counter 120. The counter 120 includes an output coupled to a first input of the comparator 126, which includes a second input coupled to the floating count window 124 and includes an output.

The metering circuit 402 further includes a pulse generator 454 coupled between the FSM 130 and an output 452, which may be implemented as a pad, pin or contact location configurable to interconnect with an external circuit. The metering circuit 402 further includes an input 458, which may be implemented as a pad, pin, or contact location configurable to interconnect with an external circuit. The input 458 is coupled to a sensor circuit 460.

The sensor circuit 460 includes a comparator 464 having a first input coupled to the input 458 and to a bias source 473, a second input coupled to a DAC 466, and an output coupled to a counter 468. In an example, the bias source 473 may include a voltage configured to level shift the input signal. Further, DAC 466 may be the same as the DAC 118, depending on the implementation. The counter 468 includes an output coupled to a first input of a comparator 470, which includes a second input coupled to a floating count window 472. The comparator 470 further includes an output.

The metering circuit 402 includes a controller, which may be implemented as the FSM 130. The FSM 130 includes outputs coupled to pulse generators 310 and 454. Further, the FSM 130 includes an input coupled to the output of comparator 126 and an input coupled to the output of comparator 470. The FSM 130 also includes an output coupled to count register 132 and an output coupled to count register 134. Additionally, the FSM 130 includes outputs coupled to floating count windows 124 and 472. The metering circuit 402 further includes a microcontroller unit (MCU) 136 coupled to count registers 132 and 134. MCU 136 may include a plurality of connections (not shown) to communicate with other circuitry of metering circuit 402 (such as transceivers, memory, and other circuits).

The external resonant tank circuits may be configured to generate a resonant signal that has damping characteristics that vary based on a parameter to be sensed. In the illustrated example, the resonant circuits are LC tank circuits including a first resonant tank circuit that includes a transistor 404 coupled between a power supply and a node 405, and including a gate coupled to output 414 of metering circuit 402. The first resonant tank circuit further includes an inductor 406 and a capacitor 408 coupled in parallel between node 405 and a second power supply, such as ground. Additionally, the first resonant tank circuit is AC coupled to input 418 through capacitor 410, which is coupled between node 405 and input 418.

The resonant tank circuits further include a second resonant tank circuit having a transistor 444 coupled between a power supply and a node 445, and including a gate coupled to output 452 of metering circuit 402. The second resonant tank circuit further includes an inductor 446 and a capacitor 448 coupled in parallel between node 445 and a second power supply, such as ground. Additionally, the second resonant tank circuit is AC coupled to input 458 through capacitor 450, which is coupled between node 445 and input 458.

In an embodiment, the FSM 130 sends a signal to pulse generator 310, causing pulse generator 310 to apply an excitation signal or pulse to output 414. The excitation signal biases transistor 404 to briefly couple the power supply to node 405, charging capacitor 408. When the excitation signal is stopped (i.e., the pulse ends), transistor 404 decouples the power supply from node 405. Charge stored by capacitor 408 is discharged into inductor 406, building up a magnetic field around the inductor 406 and reducing the voltage stored by the capacitor 408. When the capacitor 408 is discharged, the inductor 406 will have the charge stored in its magnetic field and since the inductor 406 resists changes in current flow, the energy to keep the current flowing is extracted from the magnetic field, which begins to decline, and the current flow will charge the capacitor 408 with a voltage of opposite polarity to its original charge. When the magnetic field of inductor 406 is dissipated, the current stops and the opposite polarity charge is stored in capacitor 408. The discharge/recharge process is repeated with the current flowing in the opposite direction through the inductor 406. The energy oscillates back and forth between the capacitor 408 and the inductor 406 until (if not replenished by power from an external circuit, such as the power supply through transistor 404) internal resistance makes the oscillations die out. When used in conjunction with a metering wheel 102 that has a metallized portion, the oscillations die out faster (damped) when the metallized portion is proximate to the resonant tank circuit and die out slower (undamped) when the non-metallized portion is proximate to the resonant tank circuit.

The comparators 126 and 470 compare the counts from counters 124 and 468, respectively, to discriminator thresholds from floating count windows 124 and 472, respectively. The comparator 126 produces an output indicating a state (damped or undamped) of the system 400 as determined from the input signal received at input 418. Similarly, the comparator 470 produces an output signal indicating a state (damped or undamped) of the system 400 as determined from the input signal received at the input 458.

In an embodiment, the FSM 130 uses the count detection circuit 312 of the FSM 130 to monitor the pulse counts from counters 120 and 468. The FSM 130 may selectively alter the floating count windows 124 and 472 when the output signals at the outputs of comparators 126 and 470 toggle. In an example, the floating count window 124 may have a different value from the floating count window 472, and the FSM 130 may update the floating count windows 124 and 472 independently.

Figure 5:
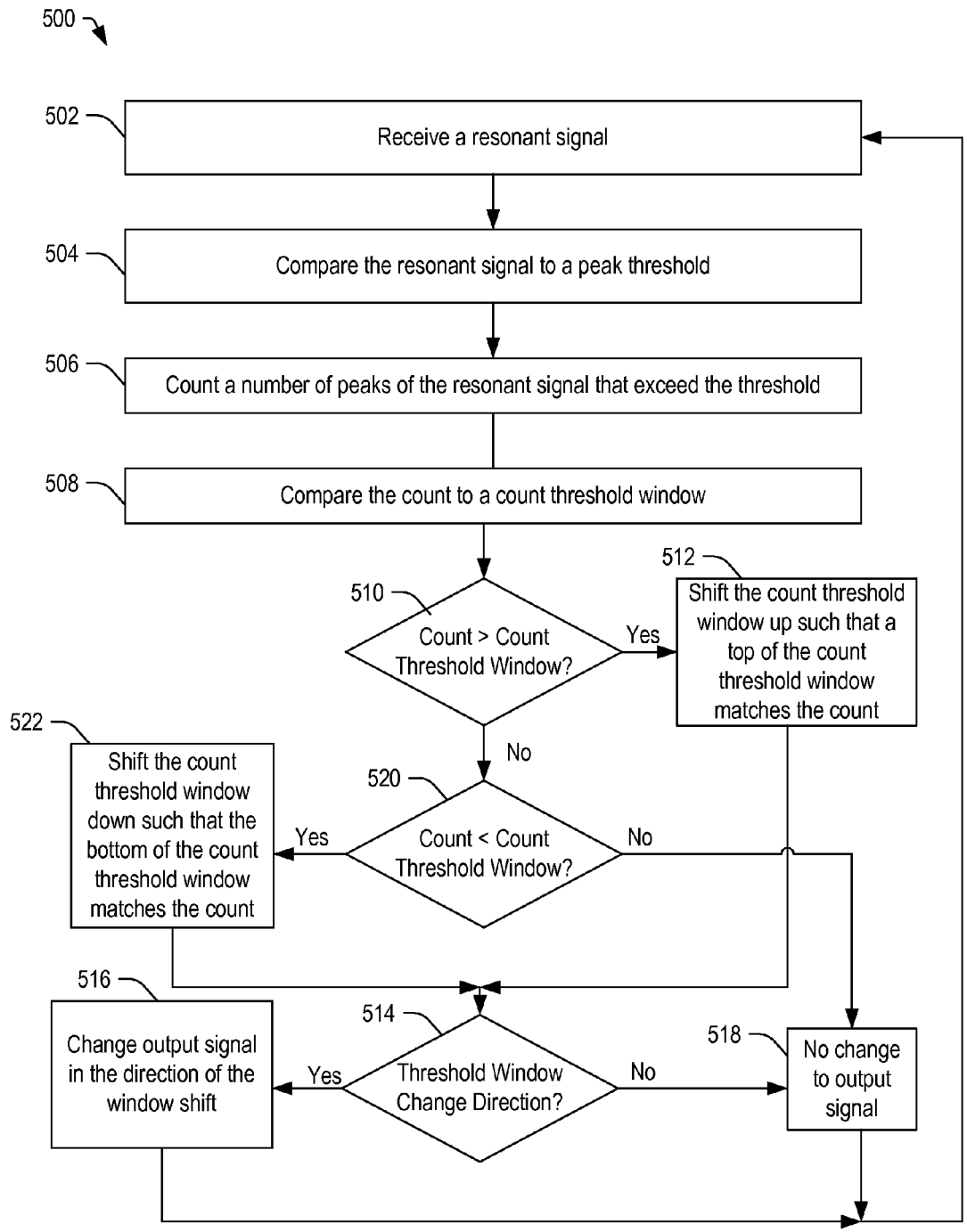
FIG. 5 is a flow diagram of a method of determining a count using a floating count window according to an embodiment.

FIG. 5 is a flow diagram of a method 500 of determining a count using a floating count window according to an embodiment. At 502, a resonant signal is received at an input of a metering circuit. In an embodiment, the resonant signal may be received from an LC tank circuit. In another embodiment, the resonant signal may be received from another signal source that produces a ringing waveform.

Advancing to 504, the resonant signal is compared to a peak threshold using a comparator of the metering circuit. Continuing to 506, a number of peaks of the resonant signal that exceed the peak threshold are counted. In an embodiment, the peaks are counted using a counter of the metering circuit. Advancing to 508, the count is compared to a count threshold window. In an embodiment, the count threshold window may be defined by a low threshold and a high threshold.

Continuing to 510, if the count is greater than the count threshold window, the method 500 advances to 512 and the count threshold window is shifted up such that the top (upper count threshold) of the count threshold window matches the count. The method 500 then proceeds to 514. At 514, if shifting the threshold window up constitutes a change in direction of the movement of the floating count window, the method 500 advances to 516 and the comparator 126 changes the output signal 128 at its output in the direction of the window shift (i.e., it transitions from a logic low level to a logic high level). Otherwise, at 514, if the floating count window has not changed direction, the method 500 continues to 518 and no change is made to the output signal at the output of the comparator. The method then returns to 502 to receive a next resonant signal.

Returning to 510, if the count is not greater than the count threshold window, the method 500 proceeds to 520. At 520, if the count is less than the count threshold window, the method 500 proceeds to 522 and the count threshold window is shifted down such that the bottom of the count threshold window matches the count. The method 500 then proceeds to 514. At 514, if shifting the threshold window down constitutes a change in direction of the movement of the floating count window, the method 500 advances to 516 and the comparator 126 changes the output signal 128 at its output in the direction of the window shift (i.e., it transitions from a logic high level to a logic low level). Otherwise, at 514, if the floating count window has not changed direction, the method 500 continues to 518 and no change is made to the output signal at the output of the comparator. The method then returns to 502 to receive a next resonant signal.

Returning to 520, if the count is not less than the count threshold window, the method 500 advances to 518, and no change is made to the output signal at the output of the comparator. The method then returns to 502 to receive a next resonant signal.

Figure 6:
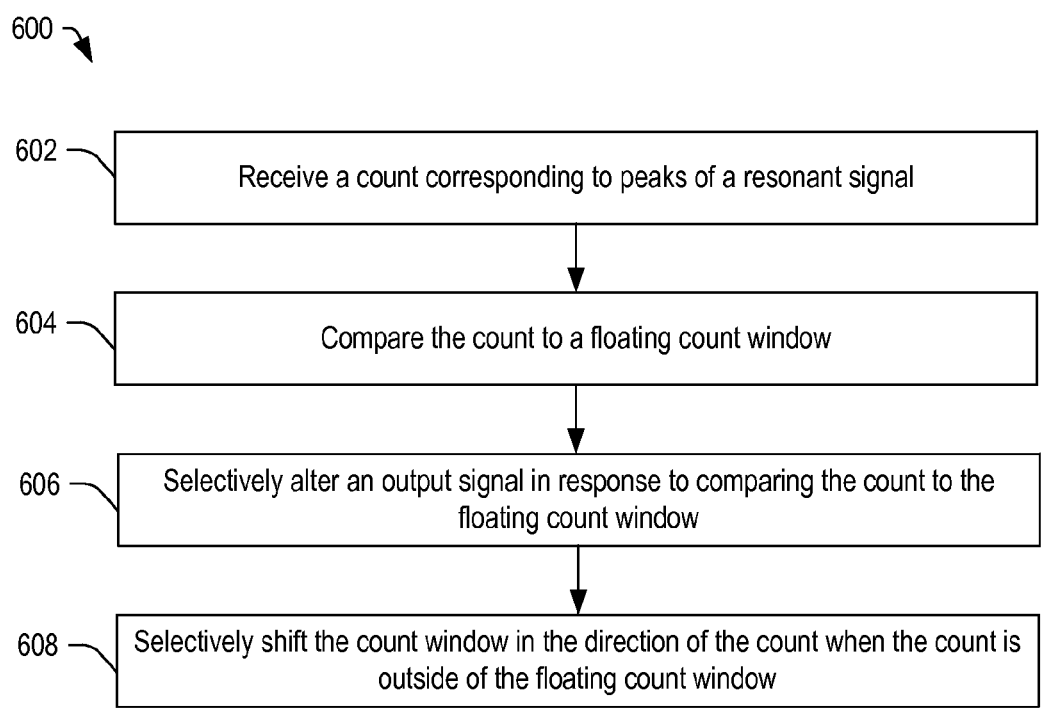
FIG. 6 is a flow diagram of a method of determining a count using a floating count window according to a second embodiment.

FIG. 6 is a flow diagram of a method 600 of determining a count using a floating count window according to a second embodiment. At 602, a count is received that corresponds to the peaks of a resonant signal. The count may be received at a first input of a comparator. Advancing to 604, the count may be compared to a floating count window. The comparator may compare the count to a high threshold and/or a low threshold to determine whether the count falls within the floating count window.

Continuing to 606, an output signal is selectively altered in response to comparing the count to the floating count window. In an embodiment, the output signal toggles from a first state to a second state when the count falls outside of the floating count window. In an embodiment, the output signal toggles in the direction of the count relative to the floating count window, such that if the count is below the floating count window, the output signal toggles from a logic high level to a logic low level or remains at a logic low level if the output signal is already at a logic low level.

Proceeding to 608, the count window is selectively shifted in the direction of the count when the count is outside of the count window. In an example, the count window is shifted down when the count falls below the count window and is shifted up when the count is above the count window.

In an embodiment, the floating count window is shifted up to match the count when the count exceeds an upper threshold of the floating count window. In another embodiment, the floating count window is shifted down to match the count when the count falls below a lower threshold of the floating count window. In still another embodiment, the floating count window is unchanged when the count falls within the floating count window.

In an embodiment, the output signal toggles to represent a state of a system when the count falls outside of the floating count window in a direction that differs from a previous shift of the floating count window. In still another embodiment, the output signal is toggled from a logical low level to a logical high level when a previous shift of the floating count window reflected a downward shift and the count exceeds an upper threshold of the floating count window. Further, the output signal is left unchanged when the previous shift of the floating count window reflected an upward shift. In yet another embodiment, the output signal toggles from a logical high level to a logical low level when a previous shift of the floating count window reflected an upward shift and the count falls below a lower threshold of the floating count window. The output signal remains unchanged when the previous shift of the floating count window reflected a downward shift.

In conjunction with the circuits and methods described above with respect to FIGS. 1-6, the metering circuit uses a floating count window to determine when the system changes from a first state to a second state. By utilizing a floating count window, the metering circuit may accurately detect the rotational state of the wheel without calibration. Thus, the metering circuit can correctly detect changes in the metering wheel even in the face of changes in temperature and voltage that might alter a threshold voltage. Instead of having to do numerous calibrations to correct the threshold, the floating window tracks the wheel movement.

In accordance with various embodiments, the floating count window and the methods described herein may be implemented in hardware or as processor readable instructions executing on a processor or on the MCU 136. In accordance with another embodiment, the floating count window and the methods described herein may be implemented using a dedicated hardware implementation including, but not limited to, application specific integrated circuits, programmable logic arrays, and other hardware devices can likewise be constructed to implement the methods described herein.

The illustrations, examples, and embodiments described herein are intended to provide a general understanding of the structure of various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Moreover, although specific embodiments have been illustrated and described herein, it should be appreciated that any subsequent arrangement designed to achieve the same or similar purpose may be substituted for the specific embodiments shown.

This disclosure is intended to cover any and all subsequent adaptations or variations of various embodiments. Combinations of the above examples, and other embodiments not specifically described herein, will be apparent to those of skill in the art upon reviewing the description. Additionally, the illustrations are merely representational and may not be drawn to scale. Certain proportions within the illustrations may be exaggerated, while other proportions may be reduced. Accordingly, the disclosure and the figures are to be regarded as illustrative and not restrictive. Workers skilled in the art will recognize that changes may be made in form and detail without departing from the scope of the disclosure.

What is claimed is:
1. A method comprising:
   receiving a count corresponding to a number of peaks of a resonant signal that exceed a reference signal;
   comparing the count to a floating count window defined by a first count threshold and a second count threshold, the first count threshold is larger than the second count threshold; and selectively shifting the floating count window in a direction of the count when the count falls outside of the floating count window.

2. The method of claim 1, further comprising shifting the floating count window up to match the count when the count exceeds the first threshold of the floating count window.

3. The method of claim 1, further comprising shifting the floating count window down to match the count when the count falls below the second threshold of the floating count window.

4. The method of claim 1, further comprising leaving the floating count window unchanged when the count falls within the floating count window.

5. The method of claim 1, further comprising selectively toggling an output signal to represent a state of a system when the count falls outside of the floating count window in a direction that differs from a previous shift of the floating count window.

6. The method of claim 5, further comprising:
toggling the output signal from a logical low level to a logical high level when a previous shift of the floating count window reflected a downward shift and the count exceeds the first threshold of the floating count window; and
leaving the output signal unchanged when the previous shift of the floating count window reflected an upward shift.

7. The method of claim 5, further comprising:
toggling the output signal from a logical high level to a logical low level when a previous shift of the floating count window reflected an upward shift and the count falls below the second count threshold; and
leaving the output signal unchanged when the previous shift of the floating count window reflected a downward shift.

8. The method of claim 5, further comprising reducing a size of the floating count window when the floating count window does not shift for a period of time that exceeds a time threshold.

9. A metering circuit comprises:
a first comparator including an input to receive a resonant signal, a second input to receive a reference signal, and an output;
a counter including an input coupled to the output and including an output to provide a count corresponding to a number of peaks of the resonant signal that exceed the reference signal; and
a second comparator to compare the count to a floating count window defined by a first count threshold and a second count threshold; and
a controller coupled to an output of the comparator and configured to selectively shift the floating count window in a direction of the count.

10. The metering circuit of claim 9, wherein the second comparator selectively toggles an output signal in response to the comparison when the controller shifts the floating count window in a direction that differs from a direction of a previous shift of the floating count window.

11. The metering circuit of claim 8, wherein the controller shifts the floating count window when the count is outside of the floating count window.

12. The metering circuit of claim 11, wherein the controller shifts the floating count window up to a level corresponding to the count when the count exceeds the first threshold of the floating count window.

13. The metering circuit of claim 11, wherein the controller shifts the floating count window down to a level corresponding to the count when the count falls below the second threshold of the floating count window.

14. The metering circuit of claim 9, wherein the controller decreases a size of the floating count window when the floating count window does not shift for a period of time that exceeds a time threshold.

15. The metering circuit of claim 9, wherein the floating count window has a size corresponding to a pre-determined number of counts.

16. An apparatus comprising:
a first comparator having a first input to receive an input signal, a second input to receive a reference signal, and an output;
a counter having an input coupled to the output of the first comparator, and including an output to provide a count; and
a count discriminator circuit to compare the count from the counter to a floating count window and to shift the floating count window to match the count when the count falls outside of the floating count window.

17. The apparatus of claim 16, wherein the count discriminator circuit selectively toggles an output signal at the output when the shift of the floating count window differs from a previous shift.

18. The apparatus of claim 17, further comprising a controller coupled to the output of the count discriminator circuit and adapted to selectively update one of a first counter and a second counter in response to the output signal.

19. The apparatus of claim 17, further comprising a controller to receive the output signal and to selectively adjust a size of the floating count window when the output signal does not toggle for a period of time that exceeds a time threshold.

20. The apparatus of claim 16, wherein the floating count window has a size that is smaller than a difference between a first peak count and a second peak count of the number of peaks of the input signal, the first peak count having a larger number of counts than the second peak count.

* * * * *